(12) United States Patent
Bosua

(10) Patent No.: US 11,802,843 B1
(45) Date of Patent: Oct. 31, 2023

(54) SYSTEMS AND METHODS FOR ANALYTE SENSING WITH REDUCED SIGNAL INACCURACY

(71) Applicant: Know Labs, Inc., Seattle, WA (US)

(72) Inventor: Phillip Bosua, Seattle, WA (US)

(73) Assignee: KNOW LABS, INC., Seattle, WA (US)

( * ) Notice: Subject to any disclaimer, the term of this patent is extended or adjusted under 35 U.S.C. 154(b) by 0 days.

(21) Appl. No.: 17/866,017

(22) Filed: Jul. 15, 2022

(51) Int. Cl.
| | |
|---|---|
| *G01R 27/04* | (2006.01) |
| *G01R 27/32* | (2006.01) |
| *G01N 22/00* | (2006.01) |
| *G01N 35/00* | (2006.01) |
| *G01N 22/02* | (2006.01) |
| *G01R 27/28* | (2006.01) |
| *G01R 35/00* | (2006.01) |
| *G01N 22/04* | (2006.01) |

(52) U.S. Cl.
CPC ............ *G01N 22/00* (2013.01); *G01N 22/02* (2013.01); *G01N 35/00871* (2013.01); *G01N 22/04* (2013.01); *G01R 27/28* (2013.01); *G01R 27/32* (2013.01); *G01R 35/005* (2013.01)

(58) Field of Classification Search
CPC .. G01N 22/00; G01N 35/00871; G01N 22/04; G01N 22/02; G01R 27/28; G01R 35/005; G01R 27/32
USPC ... 324/76.11–76.83, 459, 600, 629, 637, 638
See application file for complete search history.

(56) References Cited

U.S. PATENT DOCUMENTS

| | | | |
|---|---|---|---|
| 4,202,000 A | 5/1980 | Carballes | |
| 6,005,520 A | 12/1999 | Nalbandian et al. | |
| 7,295,827 B2 | 11/2007 | Liu et al. | |
| 8,223,021 B2 | 7/2012 | Goodnow et al. | |
| 8,882,670 B2 | 11/2014 | Hancock | |

(Continued)

FOREIGN PATENT DOCUMENTS

| | | |
|---|---|---|
| EP | 3146898 B1 | 11/2018 |
| EP | 3981329 A1 | 4/2022 |

(Continued)

OTHER PUBLICATIONS

Hanna, J. et al., "Noninvasive, wearable, and tunable electromagnetic multisensing system for continuous glucose monitoring, mimicking vasculature anatomy," Science Advances, 6, eaba5320, 2020 (11 pages).

(Continued)

*Primary Examiner* — Raul J Rios Russo
(74) *Attorney, Agent, or Firm* — Hamre, Schumann, Mueller & Larson, P.C.

(57) ABSTRACT

A method of operating a sensor system for detecting one or more analytes in a target includes preparing for an analyte scan of the target, generating an analyte scan that includes one or more frequencies in a radio or microwave range of the electromagnetic spectrum, and controlling a non-invasive sensor to implement the analyte scan of the target using. One or more of implementing a warm-up preparatory scan and/or detecting for external signal interference and the analyte scan being generated based on the detection for the external signal interference. A sensor system includes a non-invasive sensor and a controller for the non-invasive sensor. A sensor system includes a non-invasive sensor and one or more auxiliary sensors communicatively connected to the non-invasive sensor.

20 Claims, 3 Drawing Sheets

(56) References Cited

U.S. PATENT DOCUMENTS

| | | |
|---|---|---|
| 9,198,607 B2 | 12/2015 | Fischer |
| 9,864,024 B2 | 1/2018 | Vester |
| 10,149,629 B2 | 12/2018 | Szczepaniak et al. |
| 10,258,268 B2 | 4/2019 | Roblyer et al. |
| 10,405,785 B2 | 9/2019 | Ho et al. |
| 10,478,101 B1 | 11/2019 | Cespedes et al. |
| 10,548,503 B2 | 2/2020 | Bosua |
| 10,617,296 B2 | 4/2020 | Sloan et al. |
| 10,856,766 B2 | 12/2020 | Leabman |
| 10,912,500 B2 | 2/2021 | Poeze et al. |
| 10,932,698 B2 | 3/2021 | Leath et al. |
| 10,956,950 B2 | 3/2021 | Al-Ali et al. |
| 11,031,970 B1 | 6/2021 | Bosua |
| 11,033,208 B1 | 6/2021 | Bosua |
| 11,058,317 B1 | 7/2021 | Bosua |
| 11,058,331 B1 | 7/2021 | Bosua |
| 11,063,373 B1 | 7/2021 | Bosua |
| 11,193,923 B2 | 12/2021 | Bosua |
| 11,202,582 B2 | 12/2021 | Verkruijsse et al. |
| 11,223,383 B2 | 1/2022 | Bosua |
| 11,234,618 B1 | 2/2022 | Bosua et al. |
| 11,234,619 B2 | 2/2022 | Bosua |
| 11,244,753 B2 | 2/2022 | Haggerty et al. |
| 11,284,819 B1 | 3/2022 | Bosua et al. |
| 11,284,820 B1 | 3/2022 | Bosua et al. |
| 11,291,374 B2 | 4/2022 | Lee et al. |
| 11,298,037 B2 | 4/2022 | Leabman |
| 11,330,997 B2 | 5/2022 | Bosua |
| 11,350,830 B2 | 6/2022 | Mckenna et al. |
| 11,360,188 B2 | 6/2022 | Leabman |
| 11,367,525 B2 | 6/2022 | Addison et al. |
| 11,389,093 B2 | 7/2022 | Triman et al. |
| 11,426,104 B2 | 8/2022 | Schurman et al. |
| 2001/0005183 A1 | 6/2001 | Nevermann et al. |
| 2002/0198457 A1 | 12/2002 | Tearney et al. |
| 2003/0036713 A1 | 2/2003 | Bouton et al. |
| 2004/0065158 A1 | 4/2004 | Schrepfer et al. |
| 2004/0127777 A1 | 7/2004 | Ruchti et al. |
| 2004/0133086 A1 | 7/2004 | Ciurczak et al. |
| 2004/0235536 A1 | 11/2004 | Kim et al. |
| 2009/0213025 A1 | 8/2009 | Coupez et al. |
| 2009/0275814 A1 | 11/2009 | Watanabe et al. |
| 2010/0041969 A1 | 2/2010 | Beise |
| 2011/0028814 A1 | 2/2011 | Petersen et al. |
| 2013/0096396 A1 | 4/2013 | Riedel |
| 2014/0213870 A1 | 7/2014 | Hsu et al. |
| 2016/0051171 A1 | 2/2016 | Pikov et al. |
| 2016/0212530 A1 | 7/2016 | Liu et al. |
| 2016/0361002 A1 | 12/2016 | Palikaras et al. |
| 2017/0095667 A1 | 4/2017 | Yakovlev et al. |
| 2017/0181658 A1 | 6/2017 | Dettmann et al. |
| 2018/0028824 A1 | 2/2018 | Pivonka et al. |
| 2018/0132766 A1 | 5/2018 | Lee et al. |
| 2019/0008422 A1 | 1/2019 | Leath et al. |
| 2019/0053741 A1 | 2/2019 | Chaudhry |
| 2019/0104939 A1 | 4/2019 | Costantine et al. |
| 2019/0179008 A1 | 6/2019 | Tavassolian et al. |
| 2019/0269853 A1 | 9/2019 | Doyle et al. |
| 2019/0353752 A1 | 11/2019 | Lin et al. |
| 2019/0357800 A1 | 11/2019 | Bosua |
| 2019/0374135 A1 | 12/2019 | Poeze et al. |
| 2019/0388000 A1 | 12/2019 | Costantine et al. |
| 2020/0003864 A1 | 1/2020 | Chi |
| 2020/0054255 A1 | 2/2020 | Conrad et al. |
| 2020/0057163 A1 | 2/2020 | Bromberg |
| 2020/0146584 A1 | 5/2020 | Bosua |
| 2020/0187791 A1 | 6/2020 | Leabman |
| 2020/0187792 A1 | 6/2020 | Leabman |
| 2020/0187793 A1 | 6/2020 | Leabman |
| 2020/0187812 A1 | 6/2020 | Leabman |
| 2020/0187813 A1 | 6/2020 | Leabman |
| 2020/0187814 A1 | 6/2020 | Leabman |
| 2020/0187815 A1 | 6/2020 | Leabman |
| 2020/0187816 A1 | 6/2020 | Leabman |
| 2020/0187817 A1 | 6/2020 | Leabman |
| 2020/0187818 A1 | 6/2020 | Leabman |
| 2020/0187819 A1 | 6/2020 | Leabman |
| 2020/0187820 A1 | 6/2020 | Leabman |
| 2020/0187836 A1 | 6/2020 | Leabman |
| 2020/0187837 A1 | 6/2020 | Leabman |
| 2020/0187867 A1 | 6/2020 | Leabman |
| 2020/0191909 A1 | 6/2020 | Leabman |
| 2020/0191932 A1 | 6/2020 | Leabman |
| 2020/0191933 A1 | 6/2020 | Leabman |
| 2020/0191944 A1 | 6/2020 | Leabman |
| 2020/0191945 A1 | 6/2020 | Leabman |
| 2020/0191947 A1 | 6/2020 | Leabman |
| 2020/0192426 A1 | 6/2020 | Leabman |
| 2020/0192427 A1 | 6/2020 | Leabman |
| 2020/0192428 A1 | 6/2020 | Leabman |
| 2020/0193326 A1 | 6/2020 | Leabman |
| 2020/0195197 A1 | 6/2020 | Leabman |
| 2020/0195293 A1 | 6/2020 | Leabman |
| 2020/0375549 A1 | 12/2020 | Wexler et al. |
| 2021/0186356 A1* | 6/2021 | Bosua ............... G01N 22/00 |
| 2021/0186357 A1 | 6/2021 | Bosua et al. |
| 2021/0259571 A1 | 8/2021 | Bosua |
| 2021/0259592 A1* | 8/2021 | Bosua ............ A61B 5/14532 |
| 2021/0259593 A1* | 8/2021 | Bosua ............ A61B 5/14532 |
| 2022/0015695 A1 | 1/2022 | Margarito et al. |
| 2022/0031254 A1 | 2/2022 | Al-Ali et al. |
| 2022/0192494 A1 | 6/2022 | Leabman |
| 2022/0192531 A1 | 6/2022 | Leabman |
| 2022/0248984 A1 | 8/2022 | Poeze et al. |

FOREIGN PATENT DOCUMENTS

| | | |
|---|---|---|
| JP | 2012125382 A | 7/2012 |
| JP | 2014147637 A | 8/2014 |
| KR | 1020130126374 A | 11/2013 |
| KR | 1020160081740 A | 7/2016 |
| WO | 2017163245 A1 | 9/2017 |
| WO | 2019071138 A1 | 4/2019 |
| WO | 2019182638 A1 | 9/2019 |
| WO | 2019198567 A1 | 10/2019 |
| WO | 2019217461 A1 | 11/2019 |
| WO | 2020006077 A1 | 1/2020 |
| WO | 2020037171 A1 | 2/2020 |
| WO | 2021198045 A1 | 10/2021 |
| WO | 2022026623 A1 | 2/2022 |

OTHER PUBLICATIONS

"Contributes to longer healthy life expectancy with non-invasive vital acquisition sensor," Quantum Operation Co., Ltd., presentation found on Jan. 12, 2021 at https://oi.nttdata.com/program/forum/history/20191118/pdf/03_quantum-op.pdf (14 pages including English translation).

International Search Report and Written Opinion for PCT/US2019/031176, dated Aug. 23, 2019, 9 pages.

Qiang et al., "Quantitative detection of glucose level based on radiofrequency patch biosensor combined with volume-fixed structures," Biosensors and Bioelectronics 98:357-363, 2017.

Shaker, G. et al., "Non-Invasive Monitoring of Glucose Level Changes Utilizing a mm-Wave Radar System," IJMHCI, vol. 10, Issue 3 (2018): pp. 10-29.

Lien, J. et al., "Soli: Ubiquitous Gesture Sensing with Millimeter Wave Radar," ACM Trans. Graph., vol. 35, No. 4, Article 142, 19 pages (Jul. 2016).

International Search Report and Written Opinion issued for International Patent Application No. PCT/IB2020/062222, dated Mar. 25, 2021, 7 pages.

Stojanovic, R. et al., "An optical sensing approach based on light emitting diodes," Journal of Physics: Conference Series 76 (2007), pp. 1-6.

Rossiter, J. et al., "A novel tactile sensor using a matrix of LEDs operating in both photoemitter and photodetector modes," Proc of 4th IEEE International Conference on Sensors (IEEE Sensors 2005), pp. 994-997.

International Search Report and Written Opinion issued for International Patent Application No. PCT/IB2021/050805, dated May 4, 2021, 8 pages.

(56) References Cited

OTHER PUBLICATIONS

International Search Report and Written Opinion issued for International Patent Application No. PCT/IB2021/050838, dated May 6, 2021, 7 pages.

Mankowska, A. et al., "Association of C-Reactive Protein and Other Markers of Inflammation with Risk of Complications in Diabetic Subjects," The Journal Of The International Federation Of Clinical Chemistry And Laboratory Medicine, Mar. 2006, 17(1), pp. 8-11.

Mahendran, Y. et al., "Association of Ketone Body Levels With Hyperglycemia and Type 2 Diabetes in 9,398 Finnish Men," Diabetes, Oct. 2013, 62(10), pp. 3618-3626.

Nall, R., "Alcoholic Liver Cirrhosis," Healthline, Updated on Sep. 17, 2018, URL: https://www.healthline.com/health/alcoholic-liver-cirrhosis (Retrieved on May 3, 2021), 4 pages.

Allin, K. et al., "Elevated C-reactive protein in the diagnosis, prognosis, and cause of cancer," Abstract, Crit Rev Clin Lab Sci., Jul.-Aug. 2011, 48(4), 1 page (Retrieved from URL: https://pubmed.ncbi.nlm.nih.gov/22035340/ on May 5, 2021).

"Luteinizing Hormone (LH) Levels Test," MedlinePlus, URL: https://medlineplus.gov/lab-tests/luteinizing-hormone-lh-levels-test/ (Retrieved on May 5, 2021), 6 pages.

International Search Report and Written Opinion issued for International Patent Application No. PCT/IB2023/053640, dated Aug. 1, 2023, 7 pages.

\* cited by examiner

SYSTEMS AND METHODS FOR ANALYTE SENSING WITH REDUCED SIGNAL INACCURACY

FIELD

This disclosure is directed to non-invasive analyte sensors and analyte detection methods that minimize signal inaccuracy in detecting for an analyte in a target.

BACKGROUND

There is interest in being able to detect and/or measure an analyte within a target. One example is measuring glucose in biological tissue. Many non-invasive sensors are employed in a controlled setting and can suffer from inaccurate measurements when used to detect and/or measure an analyte in a non-controlled environment.

SUMMARY

This disclosure is directed to non-invasive analyte sensors and analyte detection methods that minimize external signal error in detecting for an analyte in a target.

In an embodiment, a method is directed to operating a sensor system to detect one or more analytes in a target. The sensor system includes a non-invasive sensor with at least one transmit antenna and at least one receive antenna. The method includes preparing for preparing for an analyte scan of the target, generating an analyte scan, and controlling the non-invasive sensor to implement the analyte scan of the target. Preparing for the analyte scan includes one or more of implementing a warm-up preparatory scan via the at least one transmit antenna to prepare the non-invasive sensor for conducting the analyte scan and detecting for external signal interference. The analyte scan including one or more transmit frequencies in a radio or microwave range of the electromagnetic spectrum. The warm-up preparatory scan includes at least one of the one or more frequencies of the analyte scan and/or the generating of the analyte scan is based on the detection for the external signal interference. The implementation of the analyte scan of the target includes transmitting, by the at least one transmit antenna, one or more transmit signals having the one or more transmit frequencies into the target and detecting, by the at least one receiving antenna, one or more response signals resulting from the transmission of the one or more transmit signals by the at least one transmit antenna into the target.

In an embodiment, a sensor system includes a non-invasive sensor for detecting one or more analytes in a target and a controller for the non-invasive sensor. The non-invasive sensor includes at least one transmit antenna and at least one receive antenna. The at least one transmit antenna is positioned and arranged to transmit into the target. The at least one receive antenna is positioned and arranged to detect a response resulting from transmitting by the at least one transmit antenna into the target. The controller is configured to prepare for an analyte scan of the target, generate an analyte scan, and control the non-invasive sensor to implement the analyte scan of the target. The preparing for the analyte scan of the target includes one or more of implementing a warm-up preparatory scan via the at least one transmit antenna to prepare the non-invasive sensor for conducting the analyte scan and detecting for external signal interference. The analyte scan including one or more transmit frequencies in a radio or microwave range of the electromagnetic spectrum. The warm-up preparatory scan includes at least one of the one or more frequencies of the analyte scan and/or the generating of the analyte scan is based on the detection for the external signal interference. The analyte scan is implemented using the at least one transmit antenna to transmit one or more transmit signals having the one or more transmit frequencies into the target and the at least one receiving antenna to detect one or more response signals resulting from the transmission of the one or more transmit signals by the at least one transmit antenna into the target.

In an embodiment, a sensor system includes a non-invasive sensor for detecting one or more analytes in a target and one or more auxiliary sensors configured to detect external signal interference. The non-invasive sensor includes at least one transmit antenna and at least one receive antenna. The at least one transmit antenna is positioned and arranged to transmit one or more transmit signals into the target and the at least one receive antenna is positioned and arranged to detect one or more response signals resulting from transmitting the one or more transmit signals by the at least one transmit antenna into the target. The one or more transmit signals are in a radio or microwave range of the electromagnetic spectrum. The one or more auxiliary sensors are communicatively connected to the non-invasive sensor.

DRAWINGS

Like numbers represent like features.

DETAILED DESCRIPTION

Figure 1:
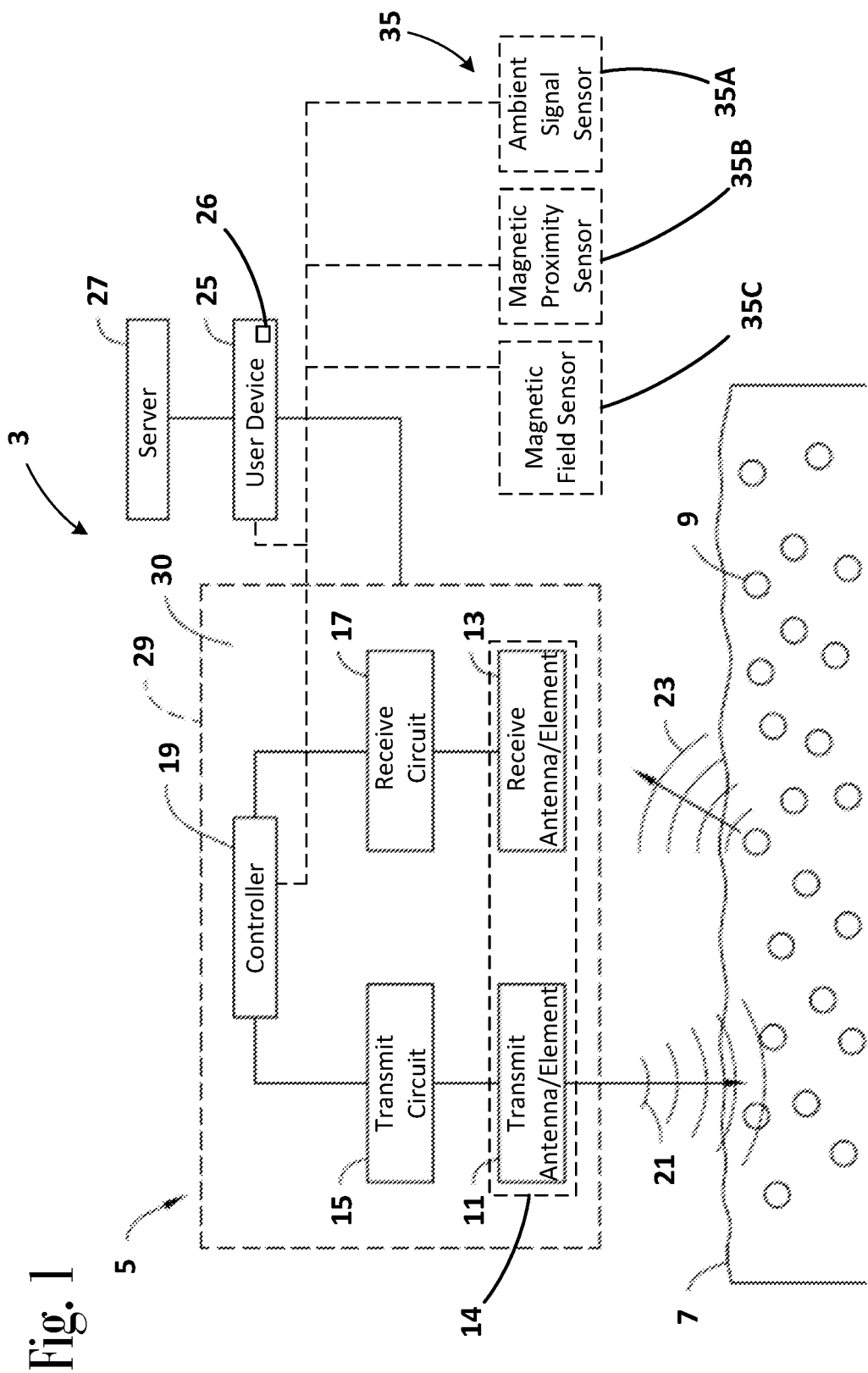
FIG. 1 shows an embodiment of an analyte detection system.

This disclosure is directed to non-invasive sensing for detection of one or more analytes in a target. More particularly, this disclosure is directed to non-invasive analyte sensors and analyte detection methods that minimize signal error in detecting for an analyte in a target.

The transmit antenna and the receive antenna can be located near the target and operated as further described herein to assist in detecting at least one analyte in the target. The transmit antenna transmits a signal in the radio or microwave frequency range toward and into the target. The receive antenna detects a response resulting from transmission of the signal by the transmit antenna into the target containing the at least one analyte of interest.

The transmit antenna and the receive antenna are decoupled (which may also be referred to as detuned or the like) from one another. Decoupling refers to intentionally fabricating the configuration and/or arrangement of the transmit antenna and the receive antenna to minimize direct communication between the transmit antenna and the receive antenna, preferably absent shielding. Shielding between the transmit antenna and the receive antenna can be utilized. However, the transmit antenna and the receive antenna are decoupled even without the presence of shielding.

The signal(s) detected by the receive antenna can be analyzed to detect the analyte based on the intensity of the received signal(s) and reductions in intensity at one or more frequencies where the analyte absorbs the transmitted signal. Examples of detecting an analyte using a non-invasive spectroscopy sensor operating in the radio or microwave frequency range of the electromagnetic spectrum are described in WO 2019/217461, U.S. Pat. Nos. 11,063,373, 11,058,331, 11,033,208, 11,284,819, 11,284,820, 10,548,503, 11,234,619, 11,031,970, 11,223,383, 11,058,317, 11,193,923, and 11,234,618, the entire contents of which are incorporated herein by reference.

In one embodiment, the sensor described herein can be used to detect the presence of at least one analyte in a target. In another embodiment, the sensor described herein can detect an amount or a concentration of the at least one analyte in the target. The target can be any target containing at least one analyte of interest that one may wish to detect. The target can be human or non-human, animal or non-animal, biological or non-biological. For example, the target can include, but is not limited to, human tissue, animal tissue, plant tissue, an inanimate object, soil, a fluid, genetic material, or a microbe. Non-limiting examples of targets include, but are not limited to, a fluid, for example blood, interstitial fluid, cerebral spinal fluid, lymph fluid or urine, human tissue, animal tissue, plant tissue, an inanimate object, soil, genetic material, or a microbe.

The analyte(s) can be any analyte that one may wish to detect. The analyte can be human or non-human, animal or non-animal, biological or non-biological. For example, the analyte(s) can include, but is not limited to, one or more of glucose, alcohol, white blood cells, or luteinizing hormone. The analyte(s) can include, but is not limited to, a chemical, a combination of chemicals, a virus, bacteria, or the like. The analyte can be a chemical included in another medium, with non-limiting examples of such media including a fluid containing the at least one analyte, for example blood, interstitial fluid, cerebral spinal fluid, lymph fluid or urine, human tissue, animal tissue, plant tissue, an inanimate object, soil, genetic material, or a microbe. The analyte(s) may also be a non-human, non-biological particle such as a mineral or a contaminant.

The analyte(s) can include, for example, naturally occurring substances, artificial substances, metabolites, and/or reaction products. As non-limiting examples, the at least one analyte can include, but is not limited to, insulin, acarboxyprothrombin; acylcarnitine; adenine phosphoribosyl transferase; adenosine deaminase; albumin; alpha-fetoprotein; amino acid profiles (arginine (Krebs cycle), histidine/urocanic acid, homocysteine, phenylalanine/tyrosine, tryptophan); andrenostenedione; antipyrine; arabinitol enantiomers; arginase; benzoylecgonine (cocaine); biotinidase; biopterin; c-reactive protein; carnitine; pro-BNP; BNP; troponin; carnosinase; CD4; ceruloplasmin; chenodeoxycholic acid; chloroquine; cholesterol; cholinesterase; conjugated 1-β hydroxy-cholic acid; cortisol; creatine kinase; creatine kinase MM isoenzyme; cyclosporin A; d-penicillamine; de-ethylchloroquine; dehydroepiandrosterone sulfate; DNA (acetylator polymorphism, alcohol dehydrogenase, alpha 1-antitrypsin, cystic fibrosis, Duchenne/Becker muscular dystrophy, analyte-6-phosphate dehydrogenase, hemoglobin A, hemoglobin S, hemoglobin C, hemoglobin D, hemoglobin E, hemoglobin F, D-Punjab, beta-thalassemia, hepatitis B virus, HCMV, HIV-1, HTLV-1, Leber hereditary optic neuropathy, MCAD, RNA, PKU, *Plasmodium vivax*, sexual differentiation, 21-deoxycortisol); desbutylhalofantrine; dihydropteridine reductase; diptheria/tetanus antitoxin; erythrocyte arginase; erythrocyte protoporphyrin; esterase D; fatty acids/acylglycines; free β-human chorionic gonadotropin; free erythrocyte porphyrin; free thyroxine (FT4); free tri-iodothyronine (FT3); fumarylacetoacetase; galactose/gal-1-phosphate; galactose-1-phosphate uridyltransferase; gentamicin; analyte-6-phosphate dehydrogenase; glutathione; glutathione perioxidase; glycocholic acid; glycosylated hemoglobin; halofantrine; hemoglobin variants; hexosaminidase A; human erythrocyte carbonic anhydrase I; 17-alpha-hydroxyprogesterone; hypoxanthine phosphoribosyl transferase; immunoreactive trypsin; lactate; lead; lipoproteins ((a), B/A-1, β); lysozyme; mefloquine; netilmicin; phenobarbitone; phenytoin; phytanic/pristanic acid; progesterone; prolactin; prolidase; purine nucleoside phosphorylase; quinine; reverse tri-iodothyronine (rT3); selenium; serum pancreatic lipase; sissomicin; somatomedin C; specific antibodies (adenovirus, anti-nuclear antibody, anti-zeta antibody, arbovirus, Aujeszky's disease virus, dengue virus, *Dracunculus medinensis, Echinococcus granulosus, Entamoeba histolytica*, enterovirus, *Giardia duodenalisa, Helicobacter pylori*, hepatitis B virus, herpes virus, HIV-1, IgE (atopic disease), influenza virus, *Leishmania donovani*, leptospira, measles/mumps/rubella, *Mycobacterium leprae, Mycoplasma pneumoniae*, Myoglobin, *Onchocerca volvulus*, parainfluenza virus, *Plasmodium falciparum*, polio virus, *Pseudomonas aeruginosa*, respiratory syncytial virus, rickettsia (scrub typhus), *Schistosoma mansoni, Toxoplasma gondii, Trepenoma pallidium, Trypanosoma cruzi/rangeli*, vesicular *stomatis* virus, *Wuchereria bancrofti*, yellow fever virus); specific antigens (hepatitis B virus, HIV-1); succinylacetone; sulfadoxine; theophylline; thyrotropin (TSH); thyroxine (T4); thyroxine-binding globulin; trace elements; transferrin; UDP-galactose-4-epimerase; urea; uroporphyrinogen I synthase; vitamin A; white blood cells; and zinc protoporphyrin.

The analyte(s) can also include one or more chemicals introduced into the target. The analyte(s) can include a marker such as a contrast agent, a radioisotope, or other chemical agent. The analyte(s) can include a fluorocarbon-based synthetic blood. The analyte(s) can include a drug or pharmaceutical composition, with non-limiting examples including ethanol or other alcohols; ketones; cannabis (marijuana, tetrahydrocannabinol, hashish); inhalants (nitrous oxide, amyl nitrite, butyl nitrite, chlorohydrocarbons, hydrocarbons); cocaine (crack cocaine); stimulants (amphetamines, methamphetamines, Ritalin, Cylert, Preludin, Didrex, PreState, Voranil, Sandrex, Plegine); depressants (barbiturates, methaqualone, tranquilizers such as Valium, Librium, Miltown, Serax, Equanil, Tranxene); hallucinogens (phencyclidine, lysergic acid, mescaline, peyote, psilocybin); narcotics (heroin, codeine, morphine, opium, meperidine, Percocet, Percodan, Tussionex, Fentanyl, Darvon, Talwin, Lomotil); designer drugs (analogs of fentanyl, meperidine, amphetamines, methamphetamines, and phencyclidine, for example, Ecstasy); anabolic steroids; and nicotine. The analyte(s) can include other drugs or pharmaceutical compositions. The analyte(s) can include neurochemicals or other chemicals generated within the body, such as, for example, ascorbic acid, uric acid, dopamine, noradrenaline, 3-methoxytyramine (3MT), 3,4-Dihydroxyphenylacetic acid (DOPAC), Homovanillic acid (HVA), 5-Hydroxytryptamine (5HT), and 5-Hydroxyindoleacetic acid (FHIAA).

FIG. 1 shows an embodiment of an analyte sensor system 3 with a non-invasive analyte sensor 5. The non-invasive analyte sensor 5 is depicted relative to a target 7 that contains one or more non-invasively detected analytes of interest 9. In this example, the non-invasive analyte sensor 5 is depicted as including an antenna array 14 that includes a transmit antenna/element 11 (hereinafter "transmit antenna 11") and a receive antenna/element 13 (hereinafter "receive antenna 13"). The sensor 5 further includes a transmit circuit 15, a receive circuit 17, and a controller 19. The non-invasive analyte sensor 5 is configured to detect the one or more non-invasively detected analytes of interest 9 in the target 7 without physical disruption to the target, as described below using transmission of electromagnetic signals and detection of responses for detection of the one or more non-invasively detected analytes of interest 9. Target 7 can be a living subject, for example a person in which the one or more analytes of interest 9 are to be detected. Target 7 can be a portion of a living subject, such as skin, blood, interstitial fluid, or the like. When the target 7 is a living subject, the receive antenna 13 may simultaneously detect the analyte present in at least both the blood and the interstitial fluid of the living subject.

The transmit antenna 11 is positioned, arranged and configured to transmit a signal 21 that is in the radio frequency (RF) or microwave range of the electromagnetic spectrum into the target 7. The transmit antenna 11 can be an electrode or any other suitable transmitter of electromagnetic signals in the radio frequency (RF) or microwave range. The transmit antenna 11 can have any arrangement and orientation relative to the target 7 that is sufficient to allow the analyte sensing to take place. In one non-limiting embodiment, the transmit antenna 11 can be arranged to face in a direction that is substantially toward the target 7.

The signal 21 transmitted by the transmit antenna 11 is generated by the transmit circuit 15 which is electrically connectable to the transmit antenna 11. The transmit circuit 15 can have any configuration that is suitable to generate a transmit signal to be transmitted by the transmit antenna 11. Transmit circuits for generating transmit signals in the RF or microwave frequency range are well known in the art. In one embodiment, the transmit circuit 15 can include, for example, a connection to a power source, a frequency generator, and optionally filters, amplifiers or any other suitable elements for a circuit generating an RF or microwave frequency electromagnetic signal. In an embodiment, the signal generated by the transmit circuit 15 can have a frequency that is in the range from about 10 kHz to about 100 GHz. In another embodiment, the frequency can be in a range from about 300 MHz to about 6000 MHz. In an embodiment, the transmit circuit 15 can be configured to sweep through a range of frequencies that are within the range of about 10 kHz to about 100 GHz, or in another embodiment a range of about 300 MHz to about 6000 MHz.

The receive antenna 13 is positioned, arranged, and configured to detect one or more electromagnetic response signals 23 that result from the transmission of the transmit signal 21 by the transmit antenna 11 into the target 7 and impinging on the one or more non-invasively detected analyte(s) 9. The receive antenna 13 can be an electrode or any other suitable receiver of electromagnetic signals in the radio frequency (RF) or microwave range. In an embodiment, the receive antenna 13 is configured to detect an electromagnetic signal having a frequency that is in the range from about 10 kHz to about 100 GHz, or in another embodiment a range from about 300 MHz to about 6000 MHz. The receive antenna 13 can have any arrangement and orientation relative to the target 7 that is sufficient to allow detection of the response signal(s) 23 to allow the analyte sensing to take place. In one non-limiting embodiment, the receive antenna 13 can be arranged to face in a direction that is substantially toward the target 7.

The receive circuit 17 is electrically connectable to the receive antenna 13 and conveys the received response from the receive antenna 13 to the controller 19. The receive circuit 17 can have any configuration that is suitable for interfacing with the receive antenna 13 to convert the electromagnetic energy detected by the receive antenna 13 into one or more signals reflective of the response signal(s) 23. The construction of receive circuits are well known in the art. The receive circuit 17 can be configured to condition the signal(s) prior to providing the signal(s) to the controller 19, for example through amplifying the signal(s), filtering the signal(s), or the like. Accordingly, the receive circuit 17 may include filters, amplifiers, or any other suitable components for conditioning the signal(s) provided to the controller 19.

The controller 19 controls the operation of the sensor 5. The controller 19, for example, can direct the transmit circuit 15 to generate a transmit signal to be transmitted by the transmit antenna 11. The controller 19 further receives signals from the receive circuit 17. The controller 19 can optionally process the signals from the receive circuit 17 to detect the analyte(s) 9 in the target 7. In one embodiment, the controller 19 may optionally be in communication with at least one external device 25 such as a user device and/or a remote server 27, for example through one or more wireless connections such as Bluetooth, wireless data connections such a 4G, 5G, LTE or the like, or Wi-Fi. If provided, the external device 25 and/or remote server 27 may process (or further process) the signals that the controller 19 receives from the receive circuit 17, for example to detect the one or more non-invasively detected analyte(s) 9. If provided, the external device 25 may be used to provide communication between the sensor 5 and the remote server 27, for example using a wired data connection or via a wireless data connection or Wi-Fi of the external device 25 to provide the connection to the remote server 27.

With continued reference to FIG. 1, the sensor 5 may include a sensor housing 29 (shown in dashed lines) that defines an interior space 30. Components of the sensor 5 may be attached to and/or disposed within the housing 29. For example, the transmit antenna 11 and the receive antenna 13 are attached to the housing 29. In some embodiments, the antennas 11, 13 may be entirely or partially within the interior space 30 of the housing 29. In some embodiments, the antennas 11, 13 may be attached to the housing 29 but at least partially or fully located outside the interior space 30. In some embodiments, the transmit circuit 15, the receive circuit 17 and the controller 19 are attached to the housing 29 and disposed entirely within the sensor housing 29.

The receive antenna 13 can be decoupled or detuned with respect to the transmit antenna 11 such that electromagnetic coupling between the transmit antenna 11 and the receive antenna 13 is reduced. The decoupling of the transmit antenna 11 and the receive antenna 13 increases the portion of the signal(s) detected by the receive antenna 13 that is the response signal(s) 23 from the target 7, and minimizes direct receipt of the transmitted signal 21 by the receive antenna 13. The decoupling of the transmit antenna 11 and the receive antenna 13 results in transmission from the transmit antenna 11 to the receive antenna 13 having a reduced forward gain and an increased reflection at output compared to antenna systems having coupled transmit and receive antennas. In an embodiment, the transmit antenna 11 and/or the receive antenna 13 can be shape-changing antennas such as arrays of controllable circuits, controllable conductive materials, or the like. When used as transmit antenna 11 and/or receive antenna 13, the shape-changing antennas can be formed at specific times so as to reduce or eliminate direct receipt of transmitted signal 21 at receive antenna 13. When used as transmit antenna and/or receive antenna 13 can have shapes and/or positions selected such that transmit antenna 11 and receive antenna 13 are decoupled from one another.

In an embodiment, coupling between the transmit antenna 11 and the receive antenna 13 is 95% or less. In another embodiment, coupling between the transmit antenna 11 and the receive antenna 13 is 90% or less. In another embodiment, coupling between the transmit antenna 11 and the receive antenna 13 is 85% or less. In another embodiment, coupling between the transmit antenna 11 and the receive antenna 13 is 75% or less.

Any technique for reducing coupling between the transmit antenna 11 and the receive antenna 13 can be used. For example, the decoupling between the transmit antenna 11 and the receive antenna 13 can be achieved by one or more intentionally fabricated configurations and/or arrangements between the transmit antenna 11 and the receive antenna 13 that is sufficient to decouple the transmit antenna 11 and the receive antenna 13 from one another.

For example, the decoupling of the transmit antenna 11 and the receive antenna 13 can be achieved by intentionally configuring the transmit antenna 11 and the receive antenna 13 to have different geometries from one another. Intentionally different geometries refers to different geometric configurations of the transmit and receive antennas 11, 13 that are intentional. Intentional differences in geometry are distinct from differences in geometry of transmit and receive antennas that may occur by accident or unintentionally, for example due to manufacturing errors or tolerances.

Another technique to achieve decoupling of the transmit antenna 11 and the receive antenna 13 is to provide appropriate spacing between each antenna 11, 13 that is sufficient to decouple the antennas 11, 13 and force a proportion of the electromagnetic lines of force of the transmitted signal 21 into the target 7 thereby minimizing or eliminating as much as possible direct receipt of electromagnetic energy by the receive antenna 13 directly from the transmit antenna 11 without traveling into the target 7. The appropriate spacing between each antenna 11, 13 can be determined based upon factors that include, but are not limited to, the output power of the signal from the transmit antenna 11, the size of the antennas 11, 13, the frequency or frequencies of the transmitted signal, and the presence of any shielding between the antennas. This technique helps to ensure that the response detected by the receive antenna 13 is measuring the analyte 9 and is not just the transmitted signal 21 flowing directly from the transmit antenna 11 to the receive antenna 13. In some embodiments, the appropriate spacing between the antennas 11, 13 can be used together with the intentional difference in geometries of the antennas 11, 13 to achieve decoupling.

In one embodiment, the transmit signal (or each of the transmit signals) can be transmitted over a transmit time that is less than, equal to, or greater than about 300 ms. In another embodiment, the transmit time can be than, equal to, or greater than about 200 ms. In still another embodiment, the transmit time can be less than, equal to, or greater than about 30 ms. The transmit time could also have a magnitude that is measured in seconds, for example 1 second, 5 seconds, 10 seconds, or more. In an embodiment, the same transmit signal can be transmitted multiple times, and then the transmit time can be averaged. In another embodiment, the transmit signal (or each of the transmit signals) can be transmitted with a duty cycle that is less than or equal to about 50%. In an embodiment, the transmit signal can include frequency sweeps having frequency steps with selected operations times to facilitate comparison of frequency sweep results, as discussed in U.S. Pat. No. 11,033,208, which is herein incorporated by reference in its entirety.

The sensor 5 can implement an analyte scan to detect for one or more analyte(s) 9 in the target 7. The analyte scan specifies how the transmitting and the detecting is to be performed by the sensor 5 for detecting the analyte(s) 9 of interest. The analyte scan specifies one or more properties for transmitting the signal(s) 21 and for detecting the corresponding response signal(s) 23 to detect the one or more analyte(s) in the target 7. For example, the analyte scan can specify operation of the transmit circuit 15 for generating the transmit signal(s) 21 and the operation of the receive circuit 17 for detecting the response signal(s) 23 to detect for the analyte(s) 9 of interest in the target 7. The analyte scan can be generated based on the analyte(s) 9 of interest and/or based on detected external signal interference, as discussed herein. The analyte scan includes the one or more transmit frequencies for the transmit signal(s) 21, as discussed herein (i.e., the one or more frequencies for the one or more transmit signal(s) 21 used for detecting the analyte(s) 9). For example, the analyte scan as implemented by the sensor 5 may transmit a single transmit signal 21, multiple transmit signal(s) at the same frequency, or multiple transmit signals at multiple frequencies (e.g., a frequency sweep). The analyte scan can also include the other properties for operating the sensor 5 to transmit the signal(s) 21 and detect the response signal(s) 23 to detect the analyte(s) 9 in the target. For example, the analyte scan may dictate which of the transmit antenna(s) are to be used for transmitting the transmit signal(s) (i.e., the antenna(s) in the antenna array 14 to be used for transmitting the transmit signal(s) 21), the receive antenna(s) to be used for detecting the response signal(s) (i.e., the antenna(s) in the antenna array 14 to be used for detecting the response signal(s) 23), a power level for the transmit signal(s) (e.g., the amplitude(s) at which the transmit signal(s) 21 are to be transmitted), time between transmit signals in the analyte scan, transmit time(s) for the transmit signal(s), etc.

Figure 2:
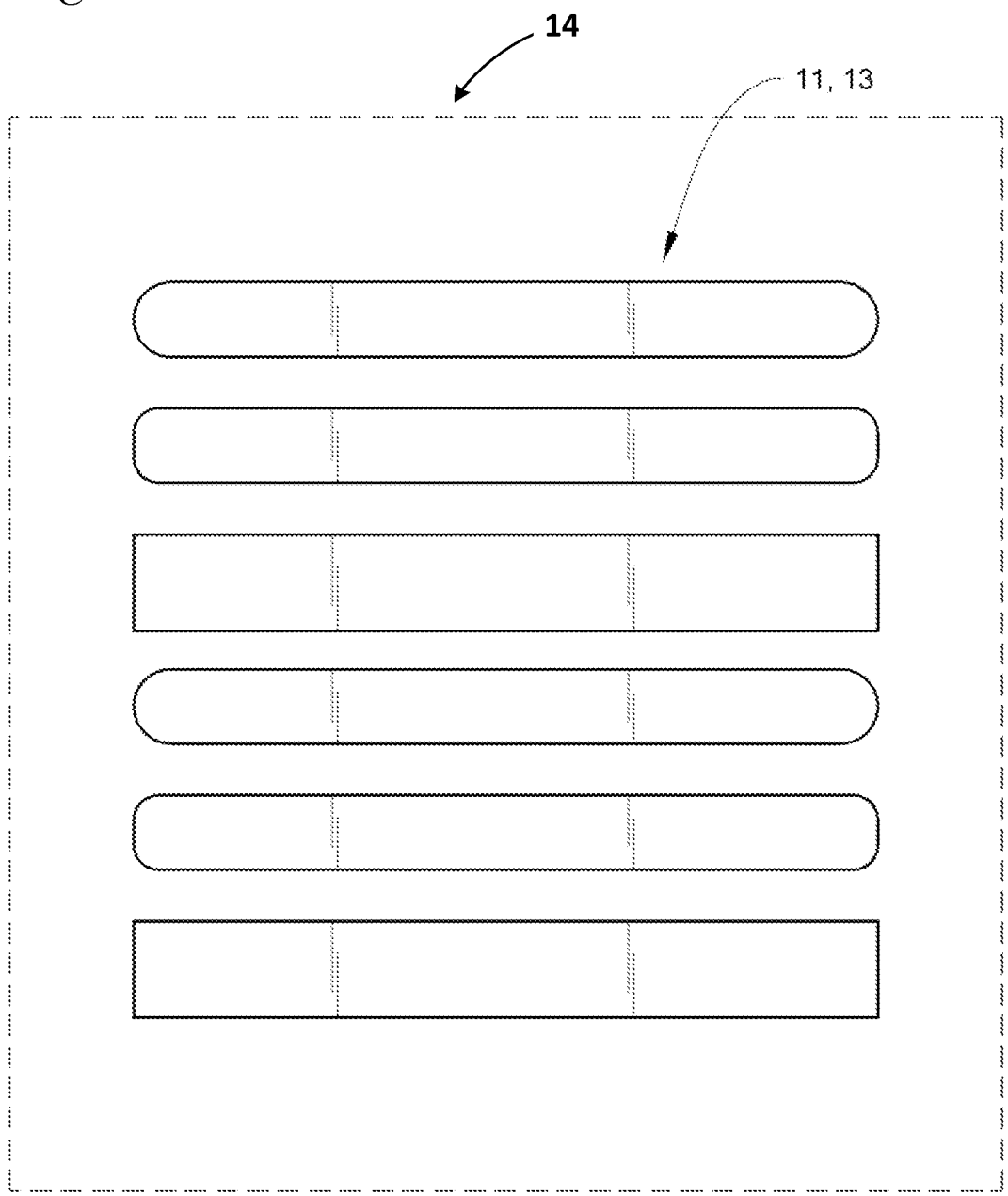
FIG. 2 shows an embodiment of an antenna array of a sensor in an analyte detection system.

The sensor 5 can include the antenna array 14 with a plurality of antennas 11, 13 having different geometries. FIG. 2 illustrates a plan view of an antenna array 14 having six antennas. In this example, the antennas differ in geometry from one another in that the shapes of the ends of the antennas, the lateral lengths and/or the lateral widths of the antennas differ from one another. The sensor 5 is configured to operate at least one of the antennas as a transmit antenna and at least one of the antennas 11, 13 as a receive antenna. For example, for an analyte scan, at least a first antenna in the antenna array 14 is connected to the transmit circuit and used to transmit the transmit signal(s) generated by the transmit circuit, and at least a second antenna in the antenna array 14 (different from the first antenna) is connected to the receive circuit and is used to receive the response signal(s). In an embodiment, the sensor can be configured to switch between different antennas in the antenna array to operate as the receiving antenna and/or to switch between different antennas in the antenna array to operate as the transmitting antenna, as discussed in U.S. Pat. No. 11,058,331, which is herein incorporated by reference in its entirety.

Referring back to FIG. 1, one or more auxiliary sensors 35 can be provided to sense ambient parameters (i.e. external signal interference) that may impact the performance of the sensor 5, for example impact the transmitted signal 21 and/or impact the return signal 23, or that may be detected by the receive antenna 13. For example, the one or more auxiliary sensors 35 can include one or more of an ambient signal sensor 35A, a magnetic proximity sensor 35B, and/or a magnetic field sensor 35C. The auxiliary sensor(s) 35 may communicate with the controller 19 of the non-invasive sensor 5 via a wired connection, a wireless connection, or a wireless data connection such as Wi-Fi. If provided, the external device 25 may be used to provide communication between the sensor 5 and the auxiliary sensor(s) 35. The auxiliary sensor(s) 35 are communicatively connected to the non-invasive sensor 5 via a wired connection, a wireless connection, or a wireless data connection. In an embodiment, said connection may be through the external device 25. In another embodiment, said connection may be a direct communicative connection between the non-invasive sensor 5 and the auxiliary sensor.

The auxiliary sensors 35 are shown as being separate to the housing 29 in FIG. 1. In another embodiment, one or more of the auxiliary sensors 35 may be provided on and/or in the same housing 29 as the non-invasive sensor 5. The auxiliary sensors 35 may each include their own respective controller, may be controlled by a single controller, may be controlled by a controller of the non-invasive sensor 5, or be controlled by a controller 26 of the external device 25. In an embodiment, the controller 19 can be further configured to process the data from the non-invasive sensor 5 along with the sensing data from one or more of the auxiliary sensor(s) 35 (e.g., sensing data of the external signal interference). In an embodiment, the controller 26 of the external device 25 may be configured to process the data from one or more of the auxiliary sensor(s) 35. The controller 19 of the non-invasive sensor 5 and/or the controller 26 of the external device 25 may be configured to control operation of the auxiliary sensor(s) 35 directly (e.g., directly control components of the auxiliary sensors 35) or indirectly (direct operation of the controller(s) of the auxiliary sensor(s) 35).

The ambient signal sensor 35A is configured to detect external ambient signals in the same frequency range used by the non-invasive sensor 5 to detect the analyte(s) 9 in the target 7. For example, the signal sensor 35A can be configured to detect for ambient signals in the radio frequency (RF) or the microwave range of the electromagnetic spectrum. In an embodiment, the ambient signal sensor 35 may also be configured to transmit signals at one or more frequencies in the radio frequency (RF) and/or the microwave range of the electromagnetic spectrum for detecting external object interference and/or external magnetic interference, as described herein. In such an embodiment, the ambient signal sensor 35 can be configured, positioned, and arranged to transmit detection signals into the ambient environment (e.g., transmit signals in the RF or microwave range, transmit in a direction away from the target 7), and detect response detection signal(s) that result from the detection signals interacting with external signal interference. A response detection signal (or the amplitude of the response detection signal) results from the interaction of a corresponding detection signal with external object interference and/or external magnetic interference. For example, the response signal(s) may be a reflection of a detection signal off of a metal or metallic object, as discussed below. For example, the ambient signal sensor 35A can include transmitting and/or receiving components as similarly described for the non-invasive sensor 5 for transmitting and/or receiving signals in the RF and/or the microwave range (e.g., at least transmit antenna 11, at least one receiving antenna 13, a transmit circuit 15, a receive circuit 17, etc.). The ambient signal sensor 35A is not used for detecting analyte(s) 9 in the target 7.

The magnetic proximity sensor 35B is configured to sense the presence of a metallic or partially metallic object near the sensor 5 and/or the target 7 that could interfere with the sensing function of the sensor 5. In particular, the magnetic proximity sensor 35B can be configured to sense the presence of metallic objects near the sensor 5 and/or the target 7 that may interact with signals transmitted and/or received in the frequency range used by the sensor 5. One example of a magnetic proximity sensor 35B is an inductive sensor that generates a magnetic field that senses the presence of a metallic object based on as the metallic object affecting the generated magnetic field. The general construction of magnetic proximity sensors is well known in the art.

The magnetic field sensor 35C is configured to sense a magnetic field in the ambient environment of the non-invasive sensor 5 (e.g., magnetic fields generated external of the target 7 and external of the sensor system 3). One non-limiting example of a magnetic field sensor 35C is a Hall effect sensor that utilizes the hall effect to detect the presence and strength of a magnetic field. The construction of magnetic field sensors is well known in the art.

External signal interference can include ambient signal interference. Ambient signal interference is the interference caused by electromagnetic signals output from electronic devices other than the sensor system 3 that can interfere with the response signal 23 and/or the transmit signal 21 (e.g., signals at or near the RF and/or signals at or near microwave frequencies). For example, such ambient signals may include wireless communications, such as wireless connections (e.g., Bluetooth, two-way radio, or the like), wireless data connections (e.g., 4G, 5G, LTE, Wi-Fi, or the like), radio communications (e.g., FM radio, AM radio, satellite radio, or the like), television communications, GPS communications, etc. For example, such ambient signals may be emitted during operation of various external electrical devices, such as a microwave oven or the like. The sensor system 3 can detect for ambient signal interference using the non-invasive sensor 5 and/or using the ambient signal sensor 35A. In an embodiment, the sensor system 3 may be configured to detect for the ambient signal interference using the ambient signal sensor 35A.

External signal interference can include external object interference that is interference caused by object(s) external to the target 7 and the sensor system 3 interacting with the transmit signal(s) 21 and/or the response signals 23, and said interaction affecting the response signal 23 received by the receive antenna 13. Signals in the RF frequencies can interact with a metal objects (e.g., metal containers, appliances, larger metallic objects, etc.) which causes an interference signal that affects the response signal(s) received by the receive antenna 13. For example, the interference signal can be a partial reflection of a transmit signal in the RF frequency range from a metallic object. The interference signal can combine with the response signal 23 from the target 7, causing the response signal received by the receive antenna 13 to no longer correspond with the response signal 23 from the target causing inaccuracies in the detection of the response by the receive antenna 13. The sensor system 3 can detect for external object interference using the non-invasive sensor 5, the signal sensor 35A, and/or the magnetic proximity sensor 35B. In an embodiment, the sensor system 3 may be configured to detect for the external object interference using the signal sensor 35A and/or the magnetic proximity sensor 35B.

External signal interference can also include external magnetic interference that is interference caused by magnetic fields generated by external electrics. For example, external magnetic interference may be the interference caused by a strong magnetic field generated by an external electrical device, such as an electrical motor, an electrical generator, larger power lines, etc. The sensor system 3 can detect for external magnetic interference using the magnetic field sensor 35C.

Figure 3:
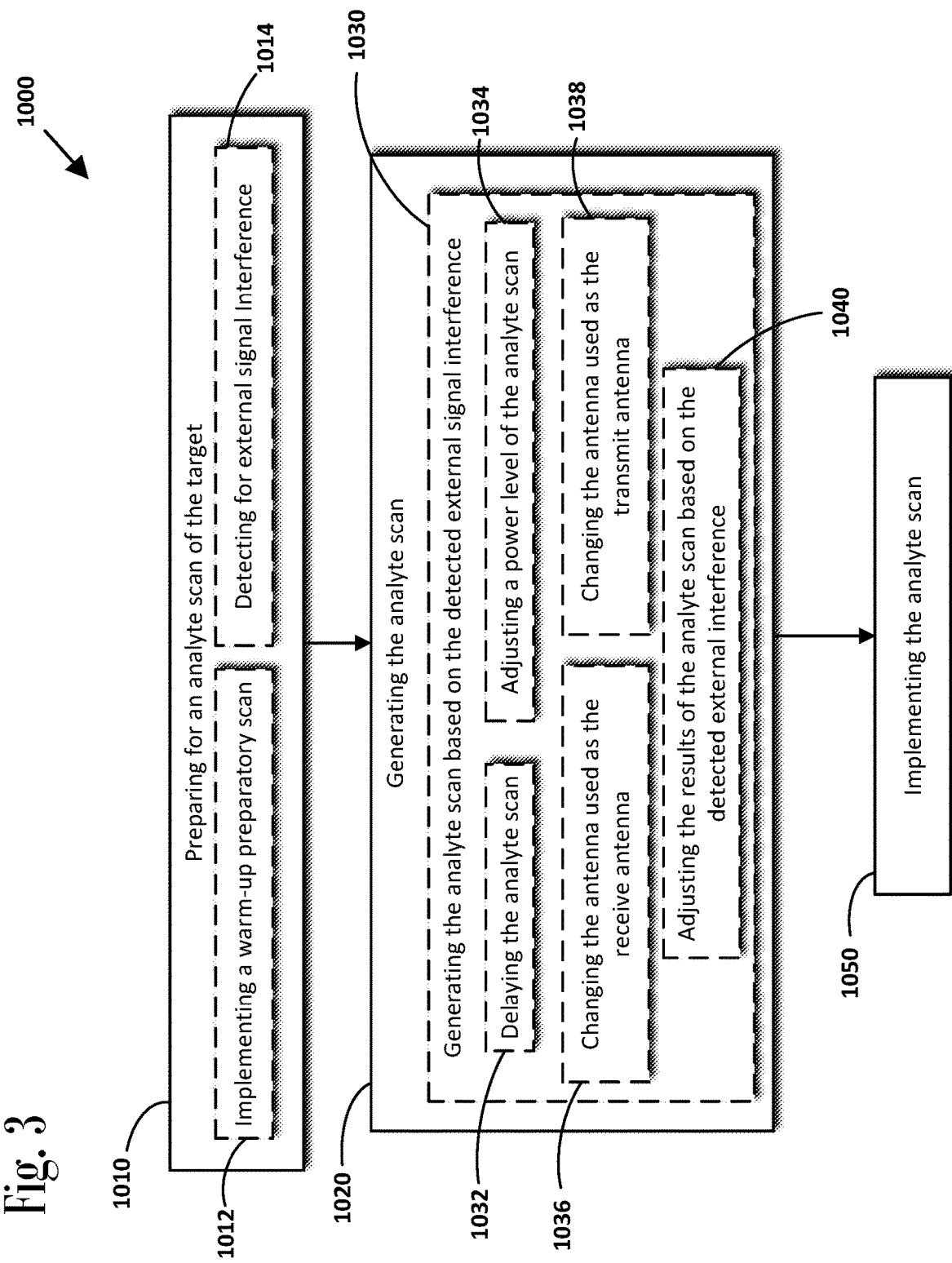
FIG. 3 shows a block flow diagram of a method of detecting one or more analytes in a subject.

FIG. 3 shows an embodiment of a method 1000 of operating a sensor system described herein, such as the sensor system 3 in FIG. 1. For example, the method 1000 may be implemented by a sensor (e.g., controller 19 of the sensor 5) and/or a user device (e.g., the controller 26 of the user device 25). The method 1000 operates the sensor system to detect one or more analytes (e.g., analyte 9) in a target (e.g., target 7). As shown in FIG. 3, the method 1000 includes preparing for an analyte scan at 1010, generating the analyte scan at 1020, and implementing the analyte scan at 1050.

The method 1000 and sensor system may be used for detecting the one or more analytes in a living target such as a person. In an embodiment, the sensor system is a non-invasive sensor system configured to non-invasively detect the analyte(s) in the target using the non-invasive sensor. For example, the target is a person, and the method 1000 non-invasively detects the analyte(s) in the person using the non-invasive sensor system. In another embodiment, the target may be a blood or tissue sample that is taken from a person, and the sensor system uses the non-invasive sensor to detect the analyte(s) in the blood or tissue sample. In such an embodiment, the sensor system may be referred to as an invasive sensor system as it detects the analyte(s) in a person by detecting the analyte in the invasively taken tissue or blood sample. In such an embodiment, the method 1000 is directed to invasively detecting the analyte(s) in the target as the method 1000 operates the sensor system to detect the analyte(s) in the invasively taken tissue or blood sample. However, even when the blood or tissue sample is removed from the body, the sensor may still be referred to as non-invasive since the sensor itself is operating non-invasively even if the target has been invasively removed.

At 1010, the analyte system prepares for performing the analyte scan of the target. The preparation 1020 includes implementing a warm-up preparatory scan at 1012 and/or detecting for external signal interference at 1014.

The warm-up preparatory scan 1012 is implemented by the non-invasive sensor that will be implementing the analyte scan (e.g., non-invasive sensor 5). For example, the warm-up preparatory scan 1012 is implemented by transmitting using the transmit antenna(s) to be used for the analyte scan. The warm-up preparatory scan 1012 as implemented may also include detecting response signals using the receiving antenna(s) to be used for the analyte scan. The warm-up preparatory scan 1012 is configured to prepare the components of the sensor for performing the analyte scan. The warm-up preparatory scan 1012 includes one or more signals at one or more frequencies within the frequency range of the analyte scan. For example, the warm-up preparatory scan 1012 may include transmitting at the maximum transmit frequency of the analyte scan, at the minimum transmit frequency of the analyte scan, and at one or more transmit frequencies between the maximum and the minimum frequency. In an embodiment, the warm-up preparatory scan 1012 can include transmitting at the same frequencies as the analyte scan. The warm-up preparatory scan 1012 may copy the analyte scan to be performed (e.g., same transmit frequencies, same power level(s), same timing, etc.). The warm-up preparatory scan 1012 is implemented before the implementation of the analyte scan at 1050, as shown in FIG. 3. In the illustrated embodiment, the warm-up preparatory scan 1012 is also shown as being implemented before the analyte scan is generated at 1020. In another embodiment, the warm-up preparatory scan 1012 may be implemented after generating the analyte scan at 1020.

The warm-up preparatory scan 1012 prepares the non-invasive sensor for conducting the analyte scan (i.e., for implementing the analyte scan at 1050). The warm-up preparatory scan is a warm-up of the non-invasive sensor (i.e., the transmitting components and/or the receiving components of the non-invasive sensor) that conditions the sensor for conducting sensing of analyte(s). For example, warm-up preparatory scan readies the non-invasive sensor for implementing the analyte scan. The warm-up preparatory scan 1012 is not used for measuring analyte(s) in the target. For example, any response signals detected during the warm-up preparatory scan 1012 are not used to indicate the presence and/or amount(s) of the analyte(s) in the target.

The sensor system detects for external signal interference at 1014 using one or more sensors of the sensor system. The sensor(s) used to detect for external signal interference at 1014 may be the non-invasive sensor (e.g., non-invasive sensor 5) and/or one or more auxiliary sensor(s) of the sensor system (e.g., auxiliary sensors 35). As discussed above, external signal interference can include ambient signal interference, external magnetic interference, and external object interference. The detection for external signal interference at 1014 may include detecting for one or more of ambient signal interference, external magnetic interference, and/or external object interference using the one or more sensors of the sensor system.

For example, the non-invasive sensor and/or the auxiliary sensor may be used to detect for ambient signal interference at 1014 by detecting for and measuring ambient signals received by at least one receiving antenna of the non-invasive sensor and/or the auxiliary sensor (e.g., receiving antenna 11). In particular, the sensor system may be configured to measure any ambient signals that are at or within the frequency range for the analyte scan.

For example, the magnetic field sensor can be used to detect for external magnetic interference by sensing for any generated electronic fields (e.g., electronic field(s) generated by external electronic device(s), non-earth electronic field). External signal interference can be detected at 1014 when a generated electronic field at or above a predetermined threshold is detected (e.g., a sensing a magnetic field having at least a predetermined magnetic power level).

For example, the non-invasive sensor and/or one or more of the auxiliary sensors may be used to detect for external object interference. The non-invasive sensor and/or the auxiliary sensor detecting for ambient object interference can include transmitting a detection signal at one or more frequencies via at least one of the transmit antennas and detecting for a detection response signal at the one or more frequencies. The detection response signal can be a reflection of the detection transmit signal off the ambient object (e.g., a metallic object reflecting the RF signal). External signal interference can be detected at 1014 when a detection response signal at or above a predetermined threshold is detected (e.g., receiving a detection response signal having at least a predetermined power level). In an embodiment, the auxiliary sensor may be a magnetic proximity sensor that can be used to detect for the proximity of metal objects to the non-invasive sensor. The detecting for ambient object interference can include the magnetic proximity sensor sensing for a metallic object nearby (e.g., within a proximity that would significantly affect the results of the analyte sensing). External signal interference can be detected at 1014 when the magnetic proximity sensor detects a metallic object (e.g., when the detected effect of the metal object is above a predetermined threshold).

At 1020, the analyte scan is generated. For example, the analyte scan is generated based on the analytes to be detected. The generation of the analyte scan at 1020 includes determining one or more transmit frequencies for the transmit signal(s) of the analyte scan. The generation of the analyte scan at 1020 may also include determining one or more other properties for the frequency scan, such as but not limited to, a frequency sweep range, a frequency step size between each signal in the sweep range, selecting an antenna of the non-invasive sensor to be used as the transmit antenna, and/or selecting an antenna of the non-invasive sensor to be used as a receive antenna. The generation of the analyte scan at 1010 may include selecting one or more predetermined properties for the analyte scan that are for detecting a particular analyte or set of analytes.

The analyte scan may be generated based on the detected external signal interference 1030. The detected external signal interference being the external signal interference detected at 1014. The warm-up preparatory scan 1012 and/or generating the analyte scan based on detected external signal interference at 1030 are for reducing error in the results of the analyte scan. They are configured to avoid the analyte scan being implemented in a manner that results in incorrect measurements of the analyte in the target. For example, the analyte scan being performed by the non-invasive sensor without a warm-up of the sensor has been found to negatively impact the results of the analyte scan. For example, the analyte scan being performed during significant external signal interference can cause the results of the analyte scan to be incorrect (i.e., the measurement of one or more of the analyte(s) to be incorrect). In particular, the analyte scan being generated based on the external signal interference is configured to avoid implementing the analyte scan during external signal interference that can significantly impact the results/measurements of the analyte scan.

The generation of the analyte scan based on the detection of the external signal interference at 1030 is configured to reduce or eliminate the negative impact of the detected external signal interference on the results the analyte scan. The generation of the analyte scan based on the detected external signal interference at 1030 can include one or more changes 1032, 1034, 1036, 1038, 1040 in the generated analyte scan based on the external signal interference. In one example, the generation at 1030 may include producing an analyte scan (e.g., based on the analytes to be detected) and then changing the analyte scan based on external signal interference. In another example, the generation at 1030 may include producing an analyte scan in which said production includes the change(s) based on the detected external signal interference (e.g., the produced analyte scan already includes the change(s) based on the detected external signal interference).

At 1032, the change delays implementation of the analyte scan based on the detected external signal interference. In an embodiment, the analyte scan is delayed at 1032 for a predetermined period of time (e.g., 5 minutes, 15 minutes, 30 minutes, etc.). In another embodiment, the analyte scan is delayed at 1032 until the external signal interference is below the interference threshold. The delay at 1032 may include monitoring the external signal interference (e.g., continuously or periodically detecting the external signal interference) and ending the delay at 1032 when the detected external signal interference decreases below the interference threshold. For example, the delay can avoid/minimize the effect of ambient signal interference, external magnetic interference, and/or external object interference on the analyte scan.

At 1034, a power level of the analyte scan is based on the detected external signal interference. The power level of the analyte scan is adjusted based on the detected external signal interference. The power level is for the transmit signal transmitted by the transmit antenna(s) for the analyte scan. The change of the power level at 1034 can include changing at least one of a minimum power and maximum power of the analyte scan. For example, a decrease in maximum power of the transmit signal for the analyte scan can help avoid/minimize the effect of object interference on the analyte scan. For example, an increase in the minimum power of the transmit signal in the analyte scan can help avoid/minimize the effect of external magnetic interference and/or ambient signal interference on the analyte scan.

At 1036, the sensor system changes the antenna to be used as the receive antenna for the analyte scan based on the detected external signal interference. For example, the sensor system changes from using a first antenna in an antenna array of the non-invasive sensor (e.g., antenna array 14) to using a second antenna in the antenna array as the receive antenna for the analyte scan. The second antenna can have a shape, geometry, and/or location that reduces the impact of the external signal interference on the analyte scan.

At 1038, the sensor system changes the antenna to be used as the transmit antenna for the analyte scan based on the detected external signal interference. For example, the sensor system changes from using a first antenna in an antenna array of the non-invasive sensor (e.g., antenna array 14) to using a second antenna in the antenna array as the transmit antenna for the analyte scan. The second antenna can have a shape, geometry, and/or location that reduces the impact of the external signal interference on the analyte scan.

At 1040, the results of the analyte scan are adjusted based on the detected external signal interference. The detection of the external signal interference at 1014 can include measuring the external signal interference (e.g., measuring an amount of external signal interference), and the adjusting of the analyte scan at 1040 is adjusting the results based on the measured external signal interference. For example, the response signal for the analyte scan is adjusted (e.g., increased or decreased) based on the amount of external signal interference. The amplitude of the response signal can be adjusted (e.g., increased or decreased) based on the measured external signal interference.

Minor external signal interference may generally occur without impacting the analyte sensing by the sensor system. In an embodiment, the changes of the analyte scan in the generating of the analyte scan based on the detected external signal interference at 1030 (e.g., changes 1032, 1034, 1036, 1038, 1040) may be configured to occur when the external signal interference detected at 1014 is above a minimum threshold (e.g., sensed external signal interference is above a predetermined threshold). The analyte scan generated at 1020 and implemented at 1050 may not include any changes based on the external signal interference when the detected external signal interference is below the minimum threshold. For example, the minimum threshold can correspond to an amount of external signal interference that causes a significant impact on the results of the analyte scan. This minimum threshold of external signal interference may be predetermined based on previous testing and/or computational modeling of the non-invasive sensor. The external signal interference may be continuously or periodically measured and compared to the minimum threshold at 1020, and the analyte scan being generated based on the external signal interference at 1030 occurs when the detected external signal interference is at or above the minimum threshold.

At 1050, the sensor system implements the analyte scan. The non-invasive sensor implements the analyte scan using the receiving antenna(s) and the transmitting antenna(s) of the non-invasive sensor. The implementation of the analyte scan at 1050 includes the transmitting by the transmitting antenna(s) the transmit signal having the one or more transmit frequencies of the analyte scan into the target and detecting by the receiving antenna(s) a response signal that result from the transmitting of the transmit signal into the target. A respective response signal may be detected for each transmit signal transmitted into the target. The controller of the non-invasive sensor (e.g., controller 19), a user device connected to the non-invasive (e.g., a controller of the user device 25), and/or a server connected to the user device (e.g., a controller of the server 27) may use the detected response signal(s) to determine the presence of one or more analytes in the target, as discussed herein.

As discussed above, the generation of the analyte scan at 1020 may include adjusting the results of the analyte scan based on the detected external signal interference at 1040. Said adjustment 1040 can include increasing and/or decreasing the response signal(s) of the analyte scan based on the external inference detected at 1014. The increasing and/or decreasing of the response signal can be configured to offset the impact of the external signal interference on the response signal. For example, the amplitude of one or more of the response signal(s) (e.g., those response signals significantly impacted by the external signal interference) as detected by the non-invasive sensor at 1050 can be decreased by an amount (or a respective amount) that is at or about the same as an increase caused by the detected external signal interference. Prior testing, computational modeling, or the like of the non-invasive sensor may be conducted to determine how different external signal interferences affects signals at different frequencies.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A method of operating a sensor system to detect one or more analytes in a target, the sensor system including a non-invasive sensor having at least one transmit antenna and at least one receive antenna, the method comprising:
   preparing for an analyte scan of the target, which includes one or more of:
      implementing a warm-up preparatory scan via the at least one transmit antenna to prepare the non-invasive sensor for conducting the analyte scan, and
      detecting for external signal interference;
   generating the analyte scan, the analyte scan including one or more transmit frequencies in a radio or microwave range of the electromagnetic spectrum, and one or more of:
      the warm-up preparatory scan includes at least one of the one or more transmit frequencies of the analyte scan, and
      the generating of the analyte scan is based on the detection for the external signal interference; and
   controlling the non-invasive sensor to implement the analyte scan of the target that includes transmitting, by the at least one transmit antenna, one or more transmit signals having the one or more transmit frequencies into the target and detecting, by the at least one receiving antenna, one or more response signals resulting from the transmission of the one or more transmit signals by the at least one transmit antenna into the target.

2. The method of claim 1, wherein the preparing for the analyte scan includes implementing the warm-up preparatory scan.

3. The method of claim 2, wherein the warm-up preparatory scan is not used to measure the one or more analytes in the target.

4. The method of claim 1, wherein the preparing for the analyte scan includes the detecting for external signal interference, and the analyte scan is generated based on the detection of the external signal interference.

5. The method of claim 4, wherein the generation of the analyte scan based on the detection of the external signal interference includes one or more of:
   delaying the implementation of the analyte scan based on the external signal interference detected,
   adjusting a power level of the analyte scan based on the external signal interference detected,
   changing from a first transmit antenna of the at least one transmit antenna to a second transmit antenna of the at least one receive antenna for transmitting the one or more transmit signals for the analyte scan, based on the external signal interference detected,
   changing from a first receive antenna of the at least one receive antenna to a second antenna of the at least one receive antenna for receiving the one or more response signals for the analyte scan, based on the external signal interference detected, and
   adjusting the results of the analyte scan based on the external signal interference detected.

6. The method of claim 5, wherein the adjusting of the power level of the analyte scan includes decreasing a maximum power of the analyte scan.

7. The method of claim 5, wherein delaying the implementation of the analyte scan includes delaying the analyte scan until the external signal interference detected is below an interference threshold.

8. The method of claim 5, wherein at least one of:
   the first receive antenna and the second receive antenna have different shapes, and
   the first transmit antenna and the second transmit antenna have different shapes.

9. The method of claim 5, wherein the sensor system includes one or more auxiliary sensors, and the detecting for the external signal interference includes detecting for the external signal interference using the one or more auxiliary sensors.

10. The method of claim 9, wherein the auxiliary sensors include at least one of a magnetic field sensor and a magnetic proximity sensor used in the detecting for the external signal interference.

11. The method of claim 5, wherein the adjusting of the results of the analyte scan based on the external signal interference detected includes increasing or decreasing at least one of the one or more response signals detected during the implementing of the analyte scan based on the external signal interference detected.

12. The method of claim 4, wherein the detecting of the external signal interference includes comparing the external signal interference detected to an interference threshold.

13. A sensor system comprising:
a non-invasive sensor for detecting one or more analytes in a target, the non-invasive sensor including at least one transmit antenna and at least one receive antenna, the at least one transmit antenna is positioned and arranged to transmit into the target, the at least one receive antenna is positioned and arranged to detect a response resulting from transmitting by the at least one transmit antenna into the target; and
a controller for the non-invasive sensor, the controller configured to:
prepare for an analyte scan of the target, which includes one or more of: implementing a warm-up preparatory scan via the at least one transmit antenna to prepare the non-invasive sensor for conducting the analyte scan, and
detecting for external signal interference,
generate the analyte scan, the analyte scan including one or more transmit frequencies in a radio or microwave range of the electromagnetic spectrum, and one or more of:
the warm-up preparatory scan includes at least one of the one or more frequencies of the analyte scan, and
the generating of the analyte scan is based on the detection for the external signal interference, and
control the non-invasive sensor to implement the analyte scan of the target using the at least one transmit antenna to transmit one or more transmit signals having the one or more transmit frequencies into the target and the at least one receiving antenna to detect one or more response signals resulting from the transmission of the one or more transmit signals by the at least one transmit antenna into the target.

14. The sensor system of claim 13, wherein the preparing for the analyte scan of the target includes the implementing of the preparatory scan.

15. The sensor system of claim 14, wherein the warm-up preparatory scan is not used in measuring the one or more analytes in the target.

16. The sensor system of claim 13, wherein
the preparing for the analyte scan includes the detecting for external signal interference, and the analyte scan is generated based on the external signal interference detected, and
the generating of the analyte scan based on the detection of the external signal interference includes one or more of:
delaying the implementation of the analyte scan based on the external signal interference detected,
adjusting a power level of the analyte scan based on the external signal interference detected,
changing from a first transmit antenna of the at least one transmit antenna to a second transmit antenna of the at least one transmit antenna for transmitting the one or more transmit signals for the analyte scan, based on the external signal interference detected,
changing from a first receive antenna of the at least one receive antenna to a second antenna of the at least one receive antenna for receiving the one or more response signals for the analyte scan, based on the external signal interference detected, and
adjusting the results of the analyte scan based on the external signal interference detected.

17. The sensor system of claim 16, wherein the delaying of the implementation of the analyte scan includes delaying the analyte scan until the external signal interference being detected is below an interference threshold.

18. The sensor system of claim 16, further comprising:
one or more auxiliary sensors, the controller configured to use the one or more auxiliary sensors to detect for the external signal interference.

19. The sensor system of claim 18, wherein the one or more auxiliary sensors include at least one of a magnetic field sensor and a magnetic proximity sensor.

20. A sensor system comprising:
a non-invasive sensor for detecting one or more analytes in a target, the non-invasive sensor including at least one transmit antenna and at least one receive antenna, the at least one transmit antenna is positioned and arranged to transmit one or more transmit signals into the target, the at least one receive antenna is positioned and arranged to detect one or more response signals resulting from transmitting the one or more transmit signal by the at least one transmit antenna into the target, the one or more transmit signals being in a radio or microwave range of the electromagnetic spectrum; and
one or more auxiliary sensors configured to detect external signal interference, the one or more auxiliary sensors communicatively connected to the non-invasive sensor.

* * * * *